(12) United States Patent
Matsuzaki et al.

(10) Patent No.: US 6,707,323 B1
(45) Date of Patent: Mar. 16, 2004

(54) SEMICONDUCTOR DEVICE, MODULE HAVING A PLURALITY OF SEMICONDUCTOR DEVICES MOUNTED THEREON AND SYSTEM HAVING A PLURALITY OF MODULES INSTALLED THEREIN

(75) Inventors: Yasurou Matsuzaki, Kawasaki (JP); Masahiko Saitou, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 21 days.

(21) Appl. No.: 09/666,333

(22) Filed: Sep. 21, 2000

(30) Foreign Application Priority Data

Sep. 22, 1999 (JP) ............................................. 11-269466

(51) Int. Cl.⁷ ................................................ H03K 3/00
(52) U.S. Cl. ...................................... 327/108; 327/142
(58) Field of Search ......................... 327/108–112, 142, 327/434–437

(56) References Cited

U.S. PATENT DOCUMENTS

| | | | | |
|---|---|---|---|---|
| 4,513,256 A | * | 4/1985 | Kurihara et al. ............... 331/4 |
| 5,254,883 A | | 10/1993 | Horowitz et al. ........... 327/541 |
| 5,543,707 A | * | 8/1996 | Yoneyama et al. ......... 324/115 |
| 5,631,709 A | * | 5/1997 | Lam et al. ................... 348/531 |
| 6,268,665 B1 | * | 7/2001 | Bobry ......................... 307/66 |
| 6,310,496 B1 | * | 10/2001 | Nomura ....................... 327/112 |

* cited by examiner

Primary Examiner—Kenneth B. Wells
(74) Attorney, Agent, or Firm—Arent Fox Kintner Plotkin & Kahn, PLLC (57) ABSTRACT

There is provided a semiconductor device having an output circuit for outputting a predetermined signal, and an output-level adjusting circuit for adjusting an output level of the output circuit in response to an adjustment start signal externally supplied and outputting an adjustment end signal upon completion of adjustment. A module in which a plurality of the semiconductor devices above are mounted. The module has an adjustment-start-signal terminal for receiving the adjustment start signal externally supplied and supplying the adjustment start signal to the semiconductor devices, and an adjustment-end-signal terminal for outputting a module adjustment end signal in response to adjustment end signals from the semiconductor devices. A plurality of such modules can be mounted in such a way that the adjustment-end-signal terminal of the (N–1)-th module is connected to the adjustment-start-signal terminal of the N-th module.

17 Claims, 8 Drawing Sheets

SEMICONDUCTOR DEVICE, MODULE HAVING A PLURALITY OF SEMICONDUCTOR DEVICES MOUNTED THEREON AND SYSTEM HAVING A PLURALITY OF MODULES INSTALLED THEREIN

BACKGROUND OF THE INVENTION

1. Field of the Invention

The present invention relates to a semiconductor device capable of automatically adjusting the output-voltage level upon power-on or in response to reception of a predetermined signal. This invention also relates to a module having a plurality of such semiconductor devices mounted on a board and a system having a,plurality of such modules installed therein, both the module and system being capable of automatically adjusting the output-voltage level upon power-on or in response to reception of a predetermined signal.

2. Description of the Related Art

The operation speed of CPUs in personal computers or the like become faster every year, and the frequency of signals to be output on a data bus line of a system become higher every year. To transfer high-frequency signals on a data bus line, it is necessary to narrow the amplitude of an output signal to be output on the data bus line. The important factor in this case is the precision of the output-voltage levels with respect to logic "0" and logic "1". The precision of the output-voltage levels is essential in accurately transmitting and receiving signals with a narrow amplitude between a data sender side and a data receiver side.

When the amplitude of a signal on the data bus line is sufficiently wide, there are large margins between the threshold level which distinguishes the H level from the L level and the H level and L level of a signal which is actually output from a semiconductor device. Even if there is some variation in the H level and L level of a signal, therefore, it is possible to adequately detect the H level and L level. Narrowing the amplitude of signals in order to ensure a high frequency narrows the aforementioned margins so that a variation in the H level and L level cannot be allowed.

The output-voltage level of a semiconductor device is generally set through simulation at the design phase. However, the output-voltage level of an actual product varies due to a variation in the performance or the like of transistors in the semiconductor device which is originated from a variation in the fabrication process. At the conventional relatively low data bus frequency (e.g., around 100 MHz), the specified values could be satisfied even with that variation. At a future higher data bus frequency (e.g., 200 MHz or higher), however, the amplitude of a signal becomes narrower, so that the variation in the output-voltage level may make a data transmission and reception difficult.

For memory devices with the RAMBUS standards, an output-level adjusting command from a memory controller is supplied to the individual memory devices installed on the board, the output level is then checked and the number of output transistors is selected so that the output level falls within the specified level. The details are described in WO 93/21572.

The adjustment of the output levels of memory devices with the RAMBUS standards is accomplished by sending an output-level adjusting command to the individual memory devices from the system side or the memory controller. In the case of a memory system that has a plurality of memory modules on which a plurality of memory devices are mounted, therefore, it is necessary to supply the adjustment command to the multiple memory devices. This puts a great burden on the system.

SUMMARY OF THE INVENTION

Accordingly, it is an object of the present invention to provide a semiconductor device which can automatically execute an output-level adjusting operation upon power-on or in response to reception of a predetermined signal.

It is another object of this invention to provide a semiconductor device which can automatically execute an output-level adjusting operation even in a semiconductor module that has a plurality of semiconductor devices upon power-on or in response to reception of a predetermined signal, and that semiconductor module.

It is a further object of this invention to provide a semiconductor device, a semiconductor module and a system which can automatically execute an output-level adjusting operation for all semiconductor device even in a system having a plurality of semiconductor modules upon power-on or in response to reception of a predetermined signal.

To achieve the above objects, according to one aspect of the present invention, there is provided a semiconductor device having an output circuit for outputting a predetermined signal, which comprises an output-level adjusting circuit for adjusting an output level of the output circuit in response to an adjustment start signal externally supplied and outputting an adjustment end signal upon completion of adjustment.

A preferable mode of this invention is a module in which a plurality of semiconductor devices mentioned above are mounted on a module board. This module has an adjustment-start-signal terminal for receiving the adjustment start signal externally supplied and supplying the adjustment start signal to the semiconductor devices, and an adjustment-end-signal terminal for outputting a module adjustment end signal in response to adjustment end signals from the semiconductor devices. Further, a system is equipped with a plurality of such modules in such a way that the adjustment-end-signal terminal of the (N−1)-th module is connected to the adjustment-start-signal terminal of the N-th module.

According to a more preferable mode, the adjustment-start-signal terminal of the first module in the above system is connected to a voltage supply whereby the semiconductor devices in the first module perform an output-level adjustment, then the semiconductor devices in the second module perform an output-level adjustment in response to the completion of the former adjustment and such an output-level adjustment is likewise automatically carried out in order to the last module.

Even if the outputs of a plurality of modules are connected in parallel to the bus, the individual modules can detect their turns based on the adjustment start signal and can thus execute an output-level adjustment in order one at a time.

To achieve the above objects, according to another aspect of the present invention, there is provided a module which comprises a module board on which the plurality of above semiconductor devices are mounted; an adjustment-start-signal terminal, provided on the module board, for receiving an adjustment start signal and supplying the adjustment start signal to the plurality of semiconductor devices; and an adjustment-end-signal terminal for outputting a module adjustment end signal in response to adjustment end signals from the plurality of semiconductor devices.

To achieve the above objects, according to a further aspect of the present invention, there is provided a module which comprises a module board on which the plurality of above semiconductor devices are mounted; an adjustment-start-signal terminal, provided on the module board, for receiving an adjustment start signal and supplying the adjustment start signal to the plurality of semiconductor devices; and an adjustment-end-signal terminal, connected in a wired-OR fashion to an open-drain output of the plurality of semiconductor devices, for outputting a module adjustment end signal upon completion of adjustment of the plurality of semiconductor devices.

To achieve the above objects, according to a still further aspect of the present invention, there is provided a system having M (M being plural) modules as recited above installed therein, wherein an adjustment-end-signal terminal of an (N–1)-th module (N being an integer equal to or greater than 2 and equal to or less than M) is connected to an adjustment-start-signal terminal of an N-th module and output-level adjustment is carried out in order from a first module to an M-th module.

DETAILED DESCRIPTION OF THE PREFERRED EMBODIMENTS

Preferred embodiments of the present invention will now be described referring to the accompanying drawings. It should however be apparent to those skilled in the art that the embodiments do not in any way restrict the technical scope of this invention.

Figure 1:
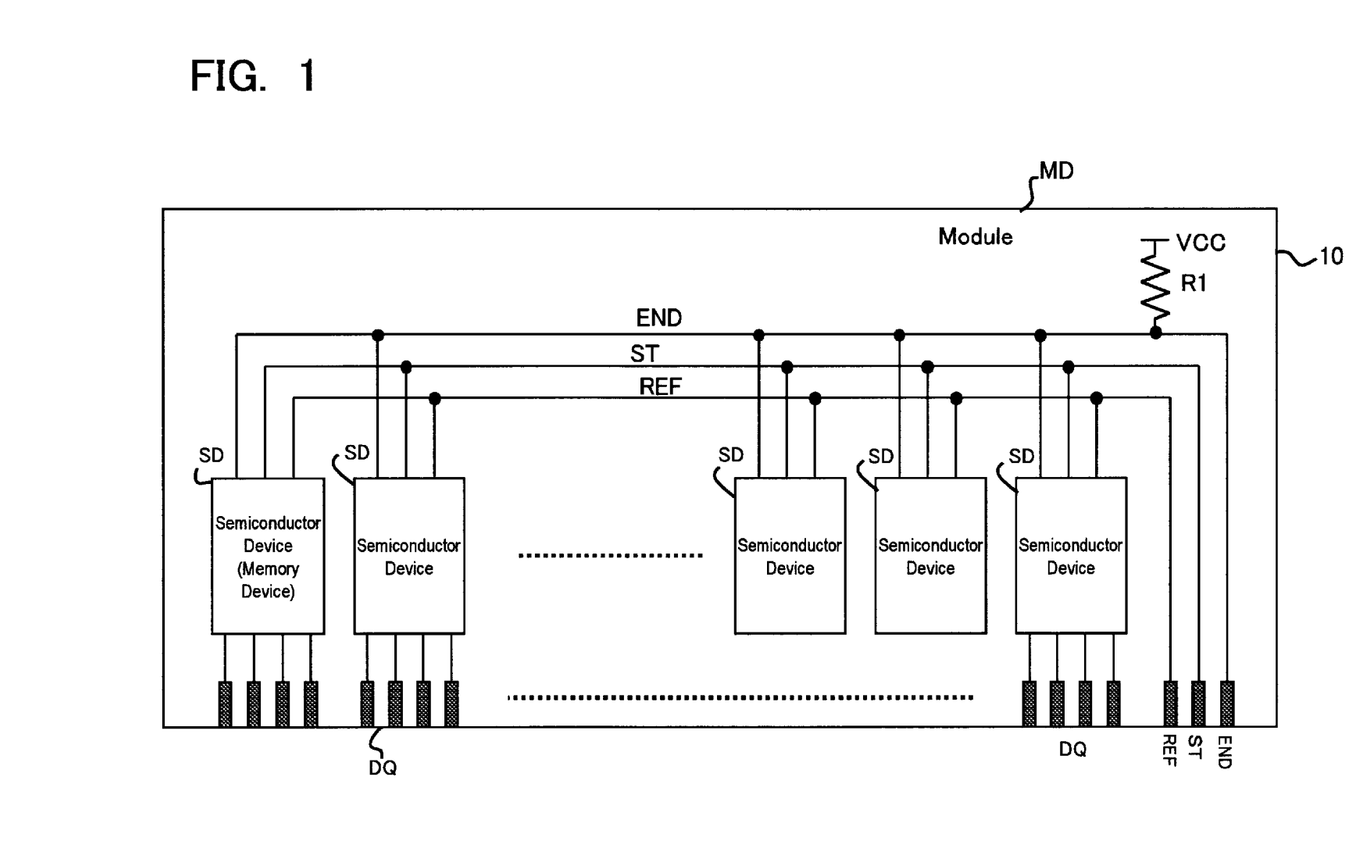
FIG. 1 is a structural diagram of a semiconductor module according to one embodiment of this invention.

FIG. 1 is a structural diagram of a semiconductor module according to one embodiment of this invention. The semiconductor module MD shown in FIG. 1 has a plurality of semiconductor devices SD mounted on a module board 10. Each semiconductor device SD is a memory device, such as DRAM, which has a data output terminal DQ, an address terminal and a command terminal, the latter two not unillustrated. The data output terminal DQ of each semiconductor device SD is connected to a terminal DQ, provided on the module board 10, through which it is further connected to a data bus to be discussed later.

The module board 10 further has an adjustment-start-signal terminal ST, an adjustment-end-signal terminal END and a reference terminal REF which are connected in parallel to the mounted individual semiconductor devices SD. A reference voltage for adjusting the output level of the devices SD is supplied to the reference terminal REF from a controller or a system side. As will be discussed later, the adjustment-start-signal terminal ST and adjustment-end-signal terminal END are respectively connected to the adjustment-end-signal terminal of the preceding semiconductor module and the adjustment-start-signal terminals of the succeeding semiconductor module. In the example of FIG. 1, the adjustment-end-signal terminal END is connected via a resistor R1 to a voltage supply Vcc on the module board.

When an adjustment start signal ST of, for example, an H level is supplied to the adjustment-start-signal terminal ST of the semiconductor module MD, the H-level signal is supplied to the individual semiconductor devices SD. In response to that signal, each semiconductor device SD adjusts the output level (L level or H level) of the output DQ of an output circuit itself by using the reference voltage that is supplied to the reference terminal REF, and outputs an adjustment end signal END upon completion of the adjustment. When all the mounted semiconductor devices output the adjustment end signals, a module adjustment end signal is output from the adjustment-end-signal terminal END of the semiconductor module MD.

Figure 2:
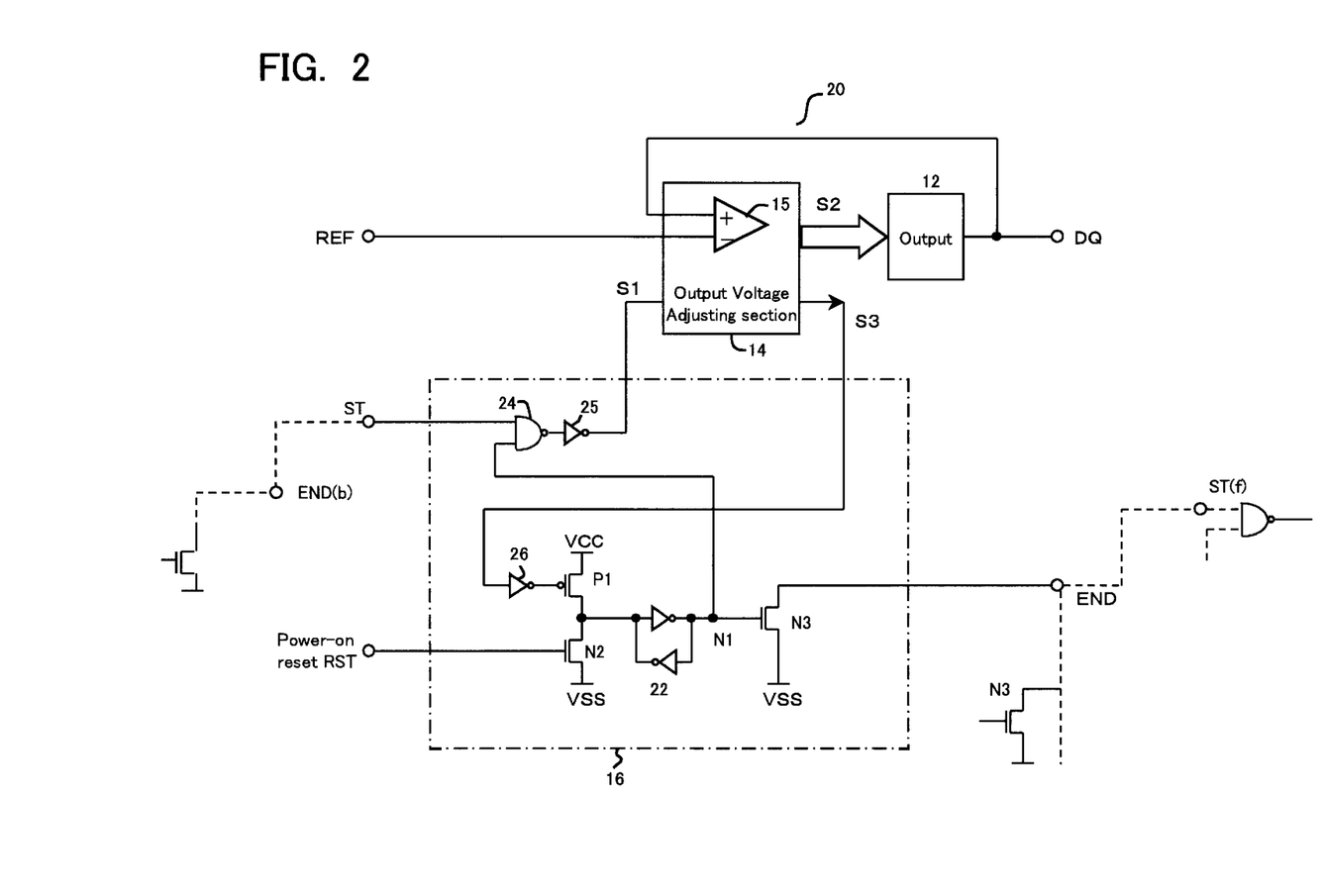
FIG. 2 is a diagram showing an output-level adjusting circuit of a semiconductor device according to this embodiment.

FIG. 2 is a diagram showing an output-level adjusting circuit of the semiconductor device according to this embodiment. An output circuit 12 which outputs an output signal DQ is provided in the semiconductor device SD. The output circuit 12 typically has a drive transistor at the final stage and outputs the output of an unillustrated internal circuit as the output signal DQ. The details of the output circuit will be given later.

The output-level adjusting circuit 20 comprises an output-voltage adjusting section 14, which compares the level of the output signal DQ produced from the output circuit 12 with the reference terminal REF and provides the output circuit 12 with an adjustment signal S2 which optimizes the output level, and a status holding circuit 16 which holds the output adjustment state. In the output-voltage adjusting section 14 is provided a comparator 15 as will be discussed later. The status holding circuit 16 incorporates a latch circuit 22, which holds a receivable state of the adjustment start signal ST in response to, for example, a power-on reset signal RST, and release the receivable state and holds an adjustment end state upon completion of the adjustment of the output level.

The status holding circuit 16 further has an N channel transistor N2 which becomes conductive or enabled in response to the reset signal RST, the latch circuit 22, and an output transistor N3 which becomes enabled or disabled in accordance with a status signal N1 from the latch circuit 22. This output transistor N3 is an end-signal generating circuit which outputs the adjustment end signal. The status signal N1 is supplied to a NAND gate 24 to which the adjustment start signal ST is supplied. When the status signal N1 has an H level, it is the state in which the adjustment start signal ST can be received. In this state, the status holding circuit 16 receives the adjustment start signal ST and generates an internal adjustment start signal S1 via a NAND gate 24 and an inverter 25 in response to that adjustment start signal ST. While the status signal N1 has the H level, the output transistor N3 is conductive so that the adjustment end signal END is kept at an L level.

When the output-voltage adjusting section 14 finishes adjusting the output level in response to the internal adjustment start signal S1, the adjusting section 14 generates an internal adjustment end signal S3. In response to this signal S3, a P channel transistor P1 in the status holding circuit 16 is enabled to invert the latch circuit 22, thereby setting the status signal N1 to an L level. Accordingly, the output transistor N3 becomes disabled or non-conductive.

The adjustment-end-signal terminal END of one semiconductor device is connected in parallel to the adjustment-end-signal terminal END of another semiconductor device provided on the same semiconductor module. As indicated by a broken line in FIG. 2, the output transistor N3 or the adjustment-end-signal generating circuit is connected in a wired-OR fashion to the output transistor N3 of another semiconductor device. The output transistor N3 of each semiconductor device is of an open-drain type and has its drain terminal wired-ORed. The adjustment end signal END is connected via the resistor to the voltage supply Vcc as shown in FIG. 1, so that when all the output transistors N3 become disabled, the adjustment end signal END of the semiconductor module becomes an H level. If the output transistor N3 of any one of the semiconductor devices stays enabled or conductive (adjustment unfinished), the adjustment end signal END of the semiconductor module remains at the L level.

As will be discussed later, a semiconductor system is constructed by connecting a plurality of semiconductor modules in parallel to the data bus. In this case, as indicated by the broken lines in FIG. 2, the adjustment end signal END(b) of the module at the preceding stage is supplied as the adjustment start signal ST, and the adjustment end signal END of the local module is supplied as the adjustment start signal ST(f) for the module at the next stage.

Figure 3:
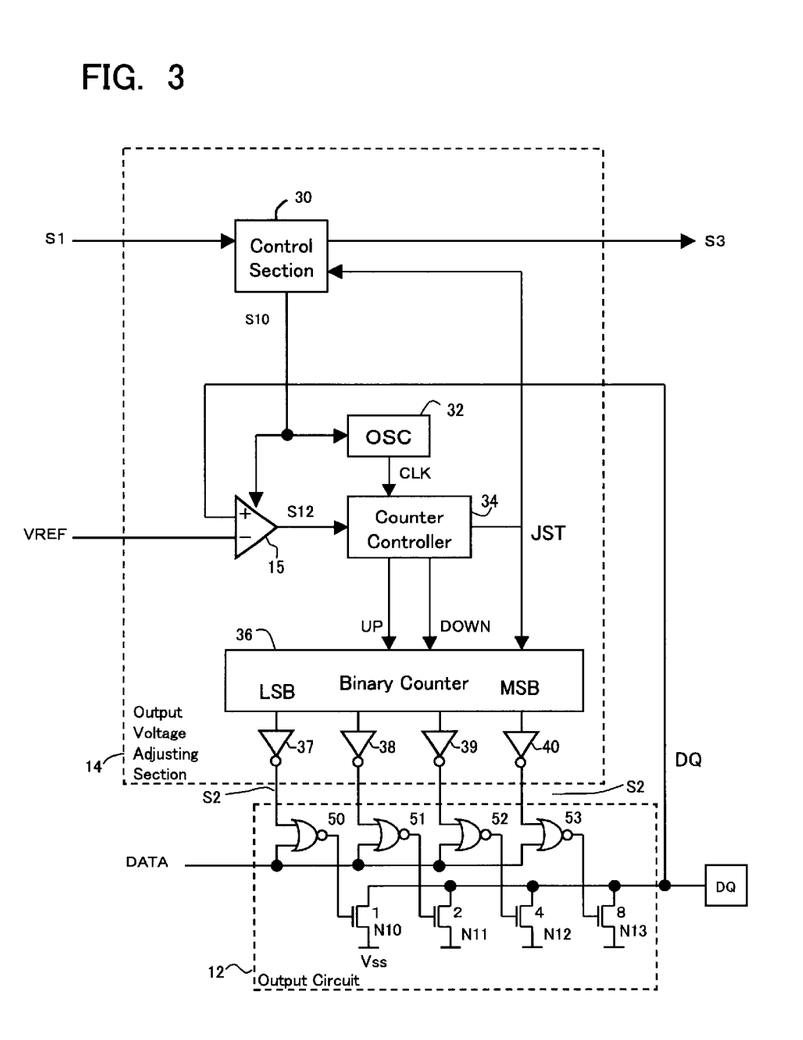
FIG. 3 is a diagram exemplifying an output-voltage adjusting section and an output circuit of the semiconductor device in FIG. 2.

FIG. 3 is a diagram exemplifying the output-voltage adjusting section and the output circuit of the semiconductor device in FIG. 2. The output circuit 12 has N channel transistors N10, N11, N12 and N13 having their drains connected to the output terminal DQ, and NOR gates 50 to 53 which supply internal data DATA to the respective N channel transistors in accordance with the adjustment signal S2 consisting of four bits. As illustrated, the drive current performances (specifically, the channel widths) of the transistors N10–N13 are set to a binary-multiple relationship of 1: 2: 4: 8. An inverted signal of the data DATA is supplied to the gate of only that transistor which corresponds to the L-level adjustment signal S2 via the associated NOR gate. An L level is forcibly given to the gate of that transistor which corresponds to the H-level adjustment signal S2 by the associated NOR gate, thus forcibly disabling that transistor.

When the adjustment signal S2 has, for example, L, L, H and L levels as a result of the adjustment of the output level, the gates 50, 51 and 53 are enabled and the three output transistors N10, N11 and N13 are enabled. Therefore, the L level of the then output DQ becomes the voltage level that is determined by the parallel connection of the impedances of the transistors N10, N11 and N13 from the ground potential Vss.

The output circuit 12 may have a plurality of P channel transistors though not illustrated. In this case, the output of a binary counter 36 is used as an adjustment signal, NAND gates are used in place of the NOR gates, and the outputs of the NAND gates are supplied to the gates of the respective P channel transistors. In this case, that transistor whose adjustment signal has an H level is enabled.

The output-voltage adjusting section 14 shown in FIG. 3 comprises a control section 30, a comparator 15, an oscillator 32, a counter controller 34 and the aforementioned binary counter 36. The control section 30 outputs an enable signal S10 in response to the internal adjustment start signal S1, and generates the internal adjustment end signal S3 in response to the a coincidence signal JST which is generated when the output level becomes optimal. The comparator 15 compares the level of the output DQ with a reference voltage REF. The oscillator 32 starts oscillating in response to the enable signal S10. The counter controller 34 generates a count-up signal UP or a count-down signal DOWN in accordance with a comparison result signal S12 from the comparator 15 in synchronism with a clock output from the oscillator 32. The binary counter 36 generates the adjustment signal S2 through inverters 37 to 40.

The output-voltage adjusting section 14 operates as follows. When the internal adjustment start signal S1 is input to the adjusting section 14, the control section 30 generates the enable signal S10 to enable the comparator 15 and the oscillator 32. The comparator 15 compares the reference voltage REF, externally supplied or internally generated, with the voltage of the output signal DQ, and sends the comparison result signal S12 representing the result of that comparison to the counter controller 34. For example, the comparison result signal S12 has information indicating if the voltage level of the output signal DQ is greater or smaller than the reference voltage REF or is close to the reference voltage REF.

The counter controller 34 generates the count-up signal UP, the count-down signal DOWN or the coincidence signal JST in accordance with the comparison result signal S12 in synchronism with the clock CLK produced by the oscillator 32. As the output circuit 12 is provided with N channel transistors which determine the L level of the output DQ, if the level of the output DQ is higher than the reference voltage REF, the count-up signal UP is output to make conductive (enable) a transistor which has a wider channel width. When the level of the output DQ is lower than the reference voltage REF, the count-down signal DOWN is output to make conductive (enable) a transistor which has a narrower channel width. When the level of the output DQ comes close to the reference voltage REF, the coincidence signal JST is generated, indicating that the output level has been properly adjusted.

In response to the coincidence signal JST, the binary counter 36 holds its count value. In response to the coincidence signal JST, the control section 30 generates the internal adjustment end signal S3 and disables the enable signal S10.

As apparent from the above, the output-voltage adjusting section 14 selects the output transistors among the group of output transistors of the output circuit 12, which should be enabled in order to set the output level to the optimal level. As a result, the output circuit 12 is so adjusted to be able to output the optimal output level in accordance with a variation in the transistor characteristics caused by a production variation in semiconductor devices or the external impedance state with semiconductor devices mounted on the module board.

Figure 4:
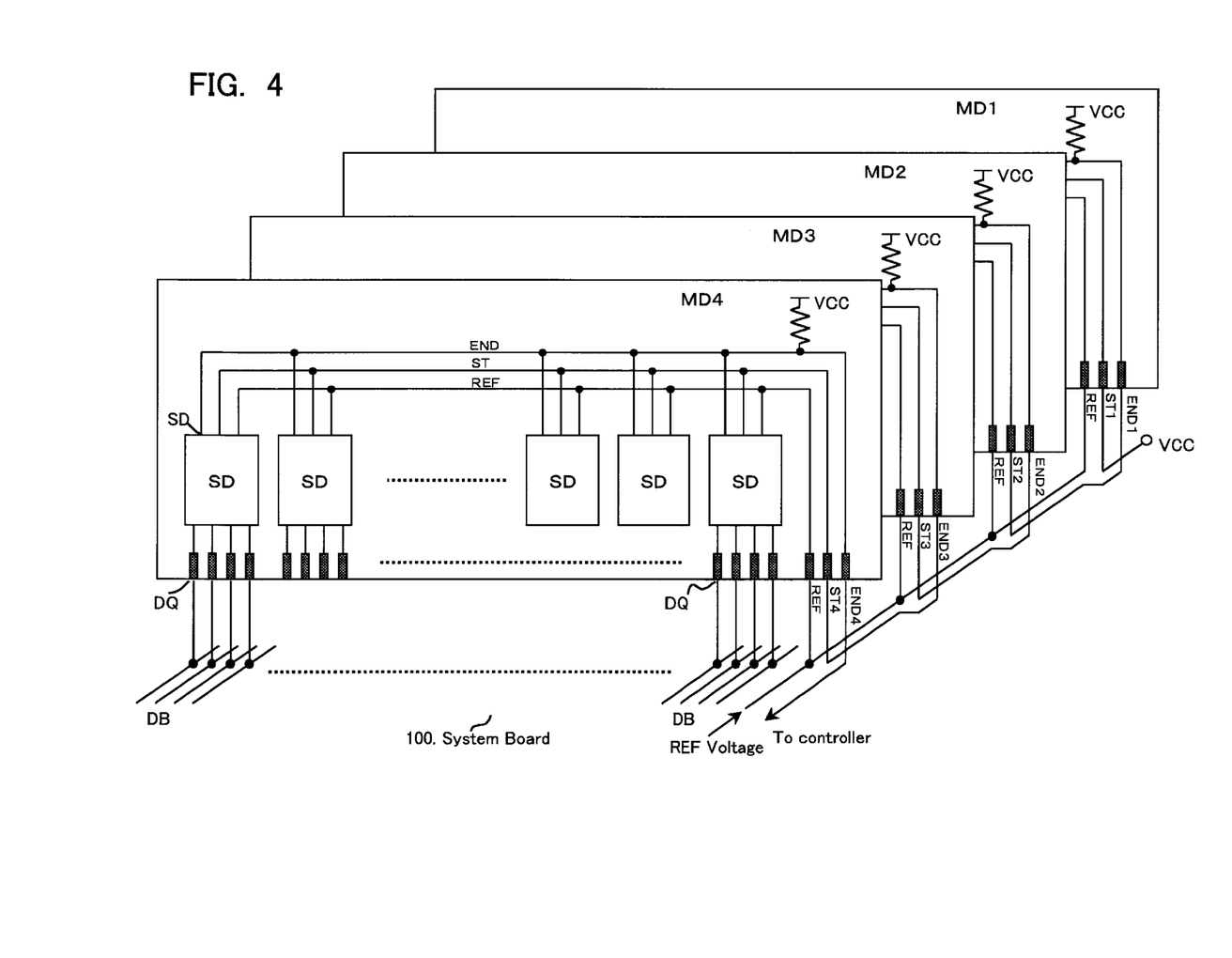
FIG. 4 is a diagram exemplifying the structure of a system in which a plurality of semiconductor modules are installed.

FIG. 4 is a diagram exemplifying the structure of a system in which a plurality of semiconductor modules are installed. FIG. 4 shows a semiconductor system which has four semiconductor modules MD1 to MD4 connected in parallel to a data bus DB provided on a system board 100. Each semiconductor module is the same as the semiconductor module MD shown in FIG. 1.

In the system illustrated in FIG. 4, the first-stage module MD1 has an adjustment-start-signal terminal ST1 connected to a voltage supply Vcc. An adjustment end signal END1 of the first-stage module MD1 is connected to an adjustment start signal ST2 of the second-stage module MD2. Likewise, an adjustment end signal END2 of the second-stage module MD2 is connected to an adjustment start signal ST3 of the third-stage module MD3, an adjustment end signal END3 of the third-stage module MD3 is connected to an adjustment start signal ST4 of the fourth-stage module MD4, and an adjustment end signal END4 of the last-stage module MD4 is supplied to, for example, the controller for the semiconductor devices or the system. This can allow the controller or system to recognize that the output adjustments for all the modules have been completed.

The common reference voltage REF is supplied to the individual modules to adjust the output level in such a way that signals of the same output level are output to the data bus DB to which the modules are connected.

In the case where a semiconductor device is a memory device such as DRAM, the system shown in FIG. 4 is a memory system mounted on a system board 100. Each module constitutes a memory module. In such a system, the output terminals DQ of the individual modules are commonly connected to the data bus DB, so that those modules cannot adjust their output levels simultaneously.

According to this embodiment, therefore, upon power-on, the modules adjust the output levels one after another, starting from the first module MD1. It is to be noted however that the individual semiconductor devices on the same module do not share the data bus line so that they can adjust the output levels simultaneously.

Figure 5:
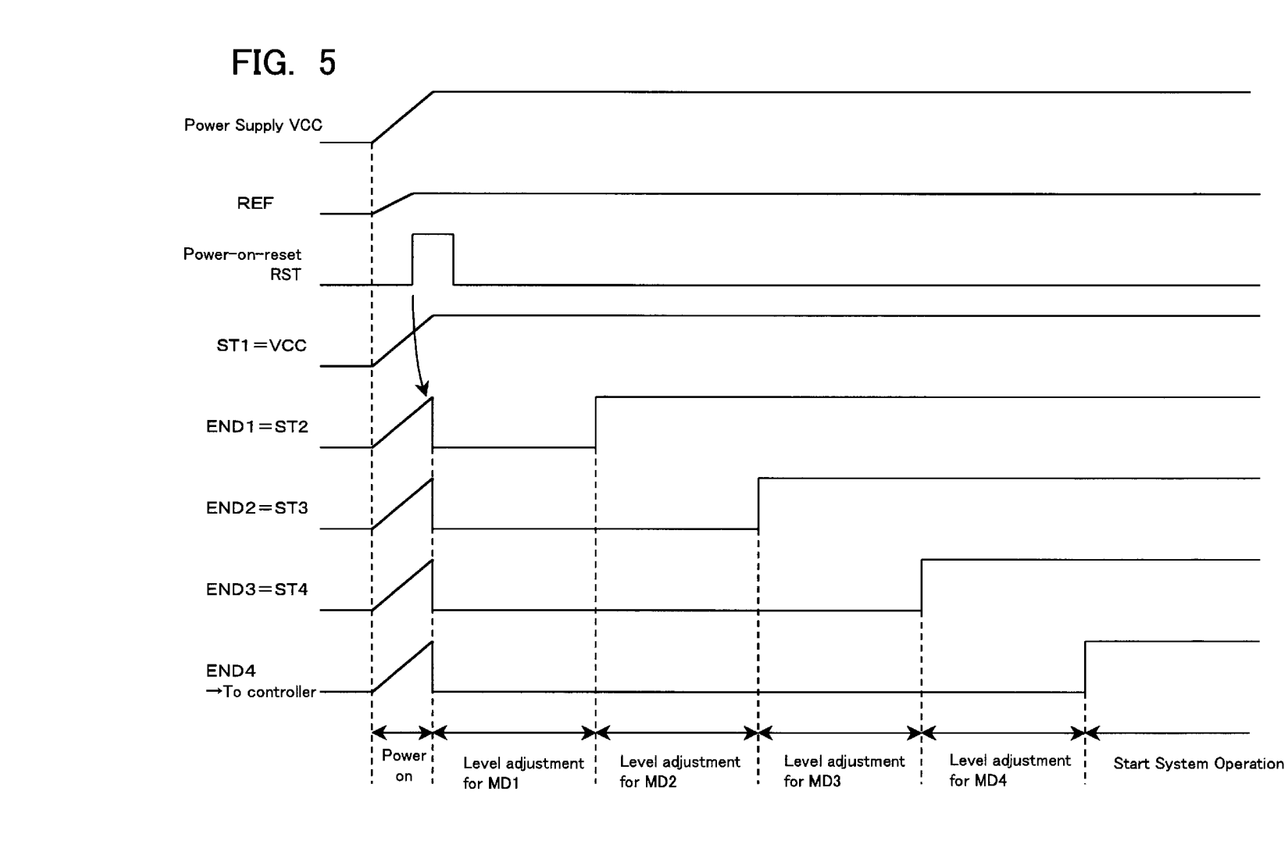
FIG. 5 is an operation timing chart of the system in FIG. 4.

FIG. 5 is an operation timing chart of the system in FIG. 4. Referring to FIG. 5, the output level adjustment of the system in FIG. 4 will be discussed below. First, in response to the power-on of the voltage supply Vcc, a power-on reset signal RST is generated in each semiconductor device DS, the status holding circuit 16 of each semiconductor device is set ready to receive the adjustment-start-signal ST, as shown in FIG. 2. In response to the power-on reset signal RST, therefore, the adjustment end signals END1 to END3 of the individual modules become L levels.

Under the situation, as the voltage supply Vcc is enabled, the H-level start signal is supplied to the adjustment-start-signal terminal ST1 of the first module MD1. In response to the signal supply, all the semiconductor devices SD of the first module MD1 start the output level adjustment. When completing the output level adjustment, the semiconductor devices SD set the signals N1 of the status holding circuits 16 to L levels and disable the output transistors N3 one after another, thus setting the adjustment end signals END in high impedance. When the output level adjustment for all the semiconductor devices SD is completed, all the wired-ORed output transistors N3 are disabled, so that an H-level end signal is output from the adjustment-end-signal terminal END1 connected via the resistor R1 to the voltage supply Vcc. This sets the status holding circuits 16 in the semiconductor devices mounted on the first module MD1 in the adjustment end state.

This adjustment end signal END1 is supplied to the adjustment-start-signal terminal ST2 of the second module MD2, which starts the output level adjustment. Thereafter, like the first module, the other modules carry out the output level adjustment one after another in the order of the second module to the fourth module. When the adjustment is completed for every module, an H-level end signal END4 is output from the adjustment-start-signal terminal ST of the fourth or last module MD4 and supplied to the unillustrated controller. Consequently, the controller recognizes that every semiconductor device in the system has completed the output level adjustment and then goes to the normal system operation.

The power-on reset signal RST may be a predetermined reset signal which is given from the unillustrated memory controller or system side. Alternatively, the memory controller or system side may supply a predetermined command signal to each semiconductor device to set the device in output level adjustable mode. Further, the adjustment start signal ST1 to the first module MD1 may be given from the memory controller or system side. Even in this case, the output level adjustment for the remaining modules MD2 to MD4 is automatically carried out in order.

Figure 6:
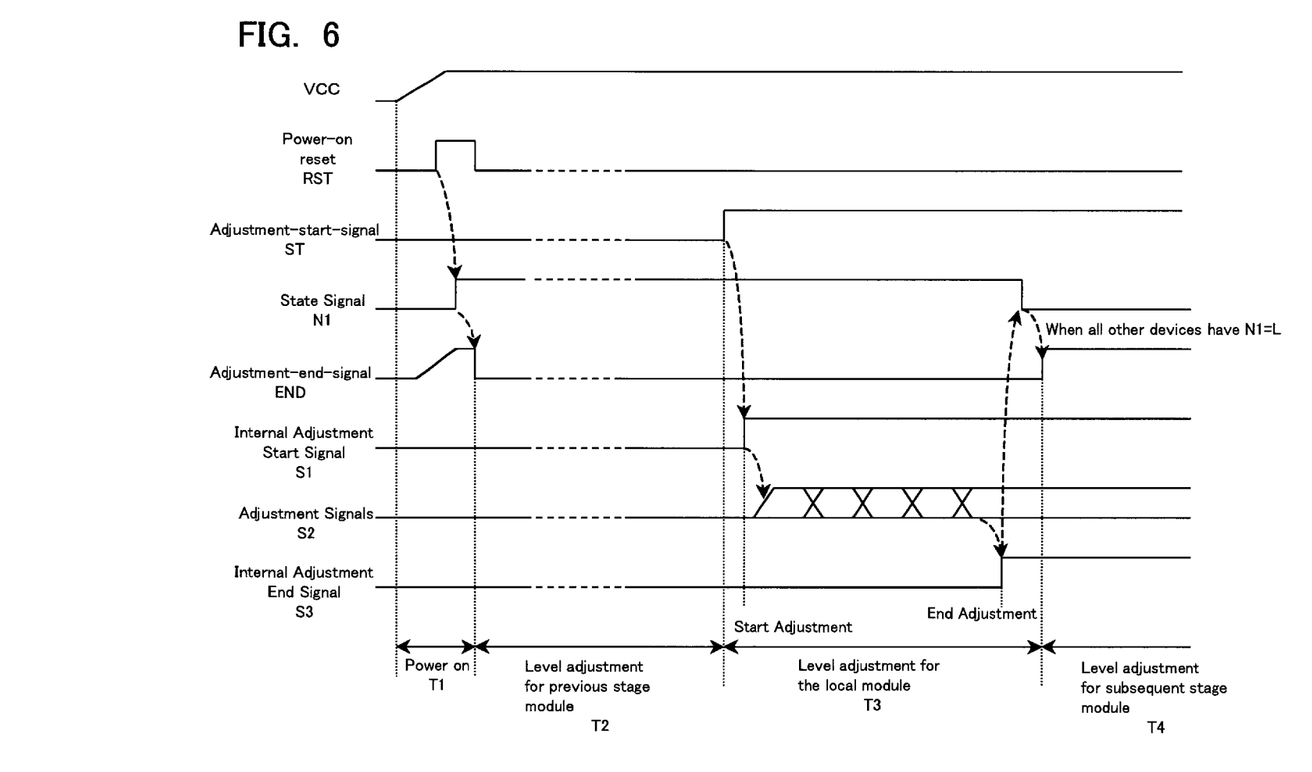
FIG. 6 is an operation timing chart of the semiconductor device in FIG. 2.

FIG. 6 is an operation timing chart of the semiconductor device in FIG. 2. As the operation of the system in which the aforementioned modules are installed has been explained clearly, the operation of the semiconductor device in FIG. 2 will now be discussed referring to the circuit in FIG. 2 and the timing chart of FIG. 6.

When the voltage supply Vcc is enabled in a period T1, the power-on reset signal RST is generated in each semiconductor device, enabling the N channel transistor N2 in the status holding circuit 16 and making the latch circuit 22 ready to receive the adjustment start signal ST. That is, the signal N1 is held at an H level. When the signal N1 goes to the H level, the output transistor N3 is enabled, causing the adjustment end signal END to become an L level.

As shown in FIG. 6, when the local module is not the first module, the output level adjustment for the module of the previous stage is executed first (period T2). When the output level adjustment of the previous-stage module is completed, the H-level adjustment start signal ST is supplied to the status holding circuit 16 so that both inputs of the NAND gate 24 become H levels, causing the internal adjustment start signal S1 to have an H level. In response to the H-level signal S1, the output-voltage adjusting section 14 adjust the level of the output DQ of the output circuit 12 to the optimal level as explained earlier, and determines the adjustment signal S2 (period T3). When the output level adjustment is completed, the output-voltage adjusting section 14 sets the internal adjustment end signal S3 to an H level, thus enabling the P channel transistor P1 in the status holding circuit 16. This inverts the latch circuit 22 so that the signal N1 becomes an L level. Consequently, the output transistor N3 is disabled. So are the output transistors N3 in the other semiconductor devices in this module. When this happens, the adjustment end signal END of the module becomes an H level. As a result, the output level adjustment for the subsequent module starts (period T4).

Figure 7:
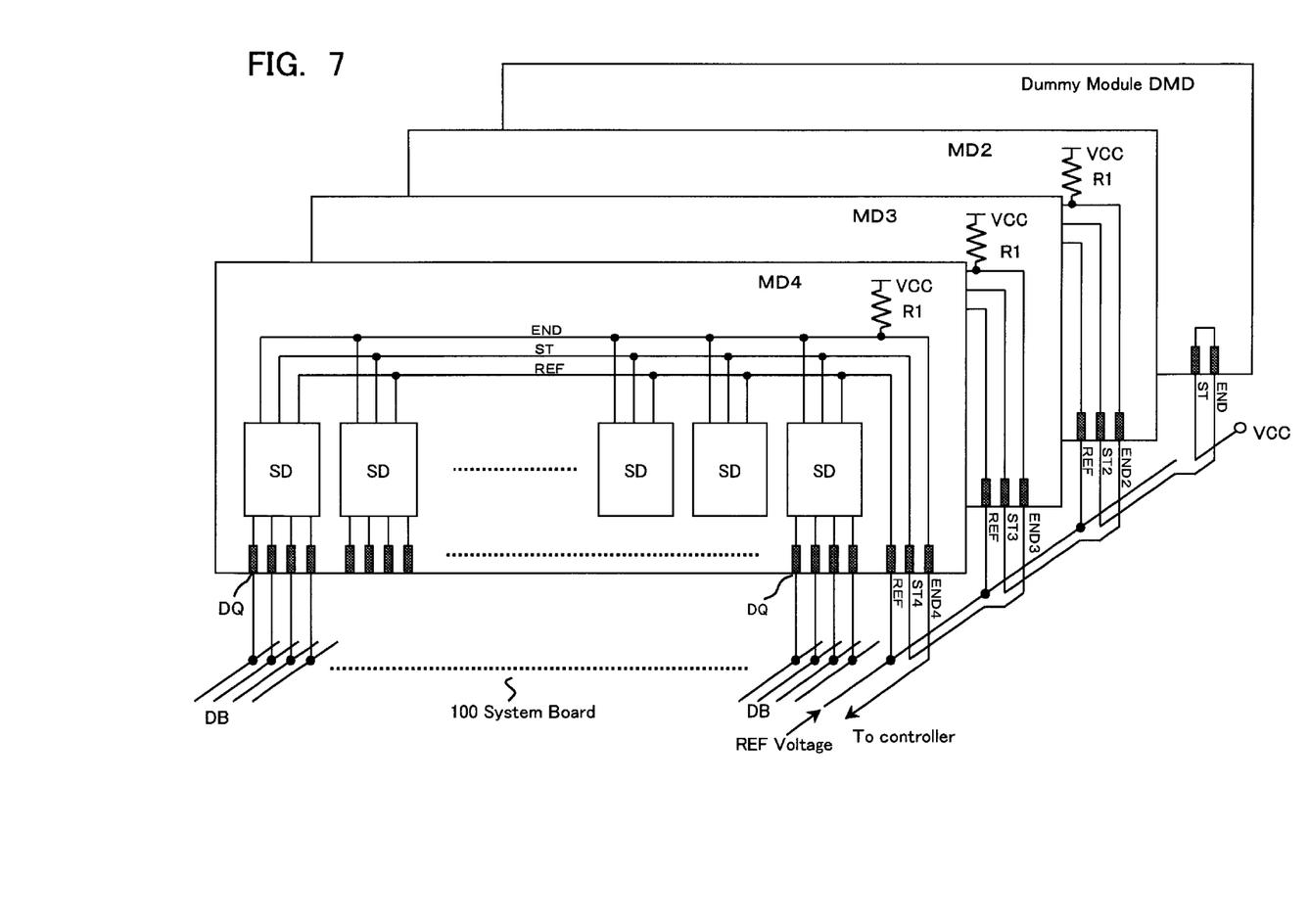
FIG. 7 is a diagram exemplifying a system structure in the case where the system has a socket where no module is to be installed.

FIG. 7 is a diagram exemplifying a system structure in the case where the system has a socket where no module is to be installed. Though not illustrated, the system board 100 is provided with sockets for installing the individual modules. Modules should not necessarily be installed in all the sockets, as certainly in the case of memory modules.

In the example of FIG. 7, the first module MD1 in the four modules of the system shown in FIG. 4 is not inserted. Instead, a dummy module DMD which has the adjustment-start-signal terminal ST and the adjustment-end-signal terminal END short-circuited is inserted. The adjustment-start-signal terminal ST of the dummy module DMD is connected to the voltage supply Vcc.

When the voltage supply Vcc is enabled, the output level adjustment starts from the second module MD2 and is automatically carried out in order to the fourth module MD4. If the module MD3 is not inserted, a dummy module DMD should be inserted in place of the module MD3, so that after the level adjustment for the module MD2 is completed, the module MD4 can start the level adjustment. The dummy module DMD may be inserted in any socket.

Figure 8:
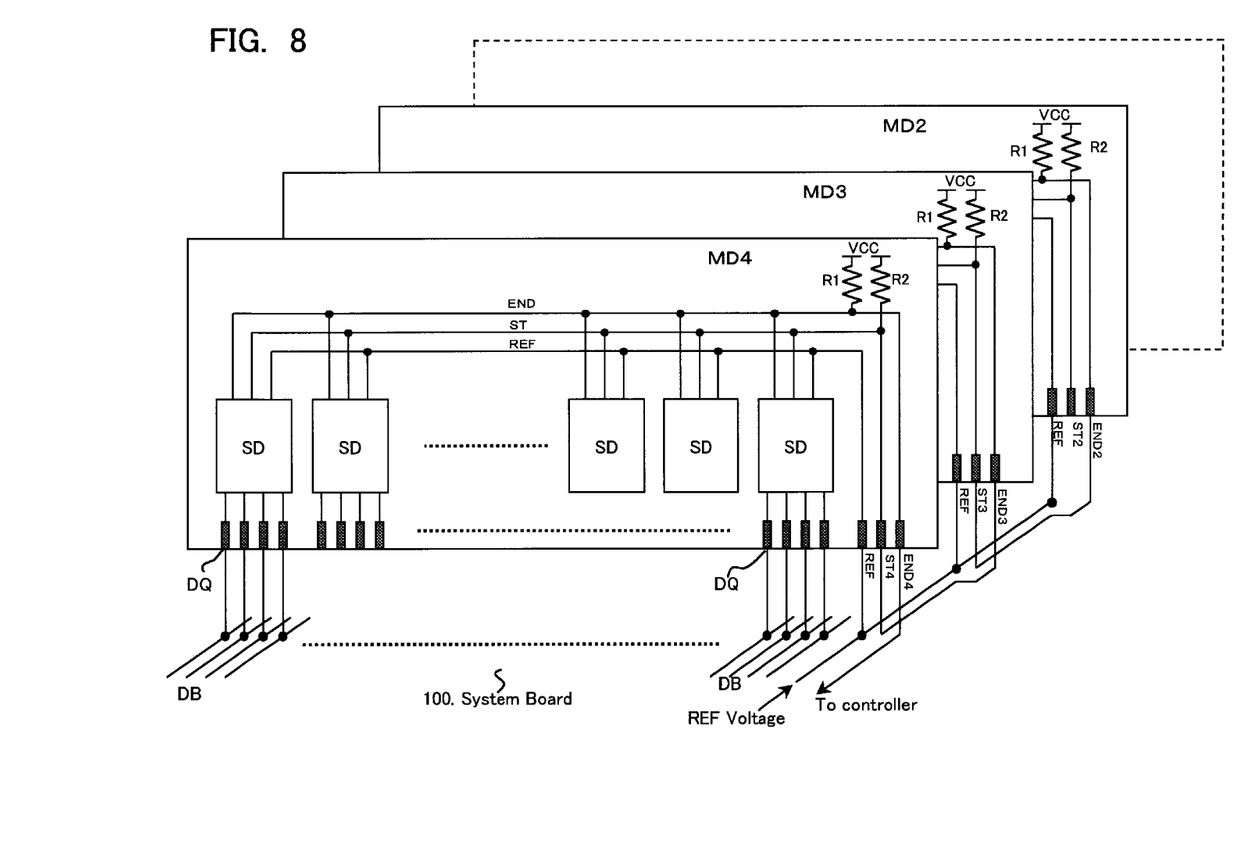
FIG. 8 is a diagram exemplifying another system structure in the case where the system has a socket where no module is to be installed.

FIG. 8 is a diagram exemplifying another system structure in the case where the system has a socket where no module is to be installed. Unlike the example of FIG. 7, the example of FIG. 8 does not require a dummy module. In this example, the adjustment-start signal line ST on each module is connected to the voltage supply Vcc via a resistor R2 having a high resistance, as shown in FIG. 8. With this design, the adjustment-start-signal terminal ST2 of the module MD2 located at the first stage need not be connected to the voltage supply Vcc but can be set open. In this case, however, it is necessary to insert the modules in the sockets, starting from the one closest to the controller by priority.

With this structure, because the adjustment-start-signal terminal ST2 of the second module MD2 whose previous stage has no module is not connected to the adjustment end terminal of the previous-stage module, the power-on action of the voltage supply Vcc provides the adjustment-start-signal terminal ST2 with an H-level signal. Note that since the adjustment-start-signal terminals ST3 and ST4 of the third and fourth modules MD3 and MD4 are connected to the adjustment end terminals END2 and END3 of the modules of the respectively previous stages, the power-on action of the voltage supply Vcc alone cannot provide the H-level adjustment start signals to the third and fourth modules MD3 and MD4.

In the above example, a dummy module need not be inserted even if there is an empty socket at the first stage. If an empty socket is located at a subsequent stage, however, a dummy module should be inserted in that empty socket shown in FIG. 7.

Although the power-on reset signal is used as the reset signal RST in the above-described embodiment, the reset signal may be given by the controller as mentioned earlier. In that case, a semiconductor module and a semiconductor device may be provided with reset-signal input terminals through which the reset signal from the controller is supplied. Alternatively, a reset command may be given by a command input from the controller so that the reset signal can be generated inside the device based on this command. This design can adjust the output voltage level not only upon power-on but also when it is necessary to compensate a variation in output voltage level caused by a change in temperature after the system is activated.

The semiconductor module shown in FIG. 1, even if installed alone, can effectively adjust the output level. In this case, either the adjustment-start-signal terminal ST has only to be connected to the voltage supply vcc or the start signal has only to be given from the controller. When the output adjustment of every semiconductor device in the module is completed, the adjustment end signal END of the module goes to an H level, informing the controller of the end of adjustment.

The reference voltage may be generated inside a semiconductor device. In this case, the module board does not need the reference terminal REF.

In short, according to this invention, semiconductor modules each having semiconductor devices mounted thereon can automatically carry out level adjustment in order upon power-on or in response to a predetermined control signal. It is therefore unnecessary for the system or the controller to perform tedious supply of control signals to the individual semiconductor modules to instruct the adjustment of the output level.

It should be apparent to those skilled in the art that the present invention is not limited to the details of the above-described embodiments, but is intended to embrace all alternatives, modifications and variances which fall within the scope of the appended claims.

What is claimed is:

1. A semiconductor device comprising:
    an output circuit for outputting an output signal having a first output level;
    a first terminal for receiving an adjustment start signal from outside of the device;
    an output-level adjusting circuit coupled to the first terminal, for initiating an adjustment for the first output level in comparison with a reference level in response to the adjustment start signal, and outputting an adjustment end signal upon completion of the adjustment; and
    a second terminal for outputting the adjustment end signal to outside of the device.

2. The semiconductor device according to claim 1, wherein the output-level adjusting circuit has a status holding circuit for holding a receivable state of the adjustment start signal in response to a reset signal and releasing the receivable state and holding an adjustment and state upon completion of the adjustment.

3. The semiconductor device according to claim 2, wherein the reset signal is a power-on reset signal to be generated at a power-on time or a predetermined control signal.

4. The semiconductor device according to any one of claims 1 to 3, wherein the output-level adjusting circuit has an end-signal generating circuit for generating the adjustment end signal and the end-signal generating circuit has an open-drain output.

5. A module comprising:
    a module board on which a plurality of semiconductor devices are mounted, said semiconductor devices including an output circuit for outputting an output signal having a first output level, a first terminal for receiving an adjustment start signal from outside of the devices, an output-level adjusting circuit, coupled to the first terminal, for initiating an adjustment for the first output level in comparison with a reference level in response to the adjustment start signal, and outputting an adjustment end signal upon completion of the adjustment, and a second terminal for outputting the adjustment and signal to outside of the devices;
    an adjustment-start-signal terminal, provided on the module board, for receiving the adjustment start signal and supplying the adjustment start signal to the plurality of semiconductor devices; and
    an adjustment-end-signal terminal for outputting a module adjustment end signal in response to adjustment end signals from the plurality of semiconductor devices.

6. The module according to claim 5, wherein the output-level adjusting circuit has a status holding circuit for holding a receivable state of the adjustment start signal in response to a reset signal and releasing the receivable state and holding an adjustment end state upon completion of the adjustment.

7. The module according to claim 6, the reset signal is a power-on reset signal to be generated at a power-on time or a predetermined control signal.

8. A module comprising:
a module board on which a plurality of semiconductor devices are mounted, said semiconductor devices including an output circuit for outputting an output signal having a first output level, a first terminal for receiving an adjustment start signal from outside of the devices, an output-level adjustment circuit, coupled to the first terminal, for initiating an adjustment of the first output level in comparison with a reference level in response to the adjustment start signal, and outputting an adjustment end signal upon completion of the adjustment, and a second terminal for outputting the adjustment end signal to outside of the devices; wherein the output-level adjusting circuit has an end-signal generating circuit for generating the adjustment end signal and the end-signal generating circuit has an open-drain output;

an adjustment-start-signal terminal, provided on the module board, for receiving the adjustment start signal and supplying the adjustment start signal to the plurality of semiconductor devices; and an adjustment-end-signal terminal, connected in a wired-OR fashion to the open-drain output, for outputting a module adjustment end signal upon completion of adjustment of the plurality of semiconductor devices.

9. The module according to claim 8, wherein the adjustment-end-signal terminal is connected via a predetermined resistor to a voltage supply.

10. A system having M (M being plural) modules installed therein, said module including:
a module board on which a plurality of semiconductor devices are mounted, said semiconductor devices including an output circuit for outputting an output signal having a first output level, a first terminal for receiving an adjustment start signal from outside of the device, an output-level adjusting circuit, coupled to the first terminal, for initiating an adjustment for the first output level in comparison with a reference level in response to the adjustment start signal, and outputting an adjustment end signal upon completion of the adjustment, and a second terminal for outputting the adjustment end signal to outside of the device;

an adjustment-start-signal terminal, provided on the module board, for receiving the adjustment start signal and supplying the adjustment start signal to the plurality of semiconductor devices; and an adjustment-end-signal terminal for outputting a module adjustment end signal in response to adjustment end signals from the plurality of semiconductor devices, wherein an adjustment-end-signal terminal of an (N−1)-th module (N being an integer equal to or greater than 2 and equal to or less than M) is connected to an adjustment-start-signal terminal of an N-th module and output-level adjustment is carried out in order from a first module to an M-th module.

11. A system having M (M being plural) modules installed therein, said module including:
a module board on which a plurality of semiconductor devices are mounted, said semiconductor devices including an output circuit for outputting an output signal having a first output level, a first terminal for receiving an adjustment start signal from outside of the device, an output-level adjusting circuit, coupled to the first terminal, for initiating an adjustment for the first output level in comparison with a reference level in response to the adjustment start signal, and outputting an adjustment end signal upon completion of the adjustment, and a second terminal for outputting the adjustment end signal to outside the device, wherein the output-level adjusting circuit has an end-signal generating circuit for generating the adjustment end signal and the end-signal generating circuit has an open-drain output;

an adjustment-start-signal terminal, provided on the module board, for receiving the adjustment start signal and supplying the adjustment start signal to the plurality of semiconductor devices; and an adjustment-end-signal terminal, connected in a wired-OR fashion to an open-drain output, for outputting a module, adjustment end signal upon completion of adjustment of the plurality of semiconductor devices, wherein an adjustment-end-signal terminal of an (N−1)-th module (N being an integer equal to or greater than 2 and equal to or less than M) is connected to an adjustment-start-signal terminal of an N-th module and output-level adjustment is carried out in order from a first module to an M-th module.

12. The system according to claim 10 or 11, wherein the adjustment-start-signal terminal ST of the first module is connected to a voltage supply or is supplied with a predetermined adjustment start signal.

13. The system according to claim 12, wherein the adjustment end signal to an external semiconductor system controller from the adjustment-end-signal terminal of the M-th module.

14. The system according to claim 10 or 11, wherein the output circuits of the M modules are connected in parallel to a data bus.

15. The system according to claim 10 or 11, wherein an arbitrary L-th module in the M modules is a dummy module having no semiconductor devices mounted thereon and having the adjustment-start-signal terminal connected to the adjustment-end-signal terminal.

16. The system according to claim 10 or 11, wherein the adjustment-start-signal terminal of each of the modules is connected via a predetermined resistor to a voltage supply on the module board.

17. The system according to claim 10 or 11, wherein the adjustment-end-signal terminal is connected via a predetermined resistor to a voltage supply.

* * * * *